United States Patent
Ning (10) Patent No.: US 11,862,223 B2
(45) Date of Patent: Jan. 2, 2024

(54) SEMICONDUCTOR STRUCTURE AND PREHEATING METHOD THEREOF

(71) Applicant: Changxin Memory Technologies, Inc., Anhui (CN)

(72) Inventor: Shuliang Ning, Hefei (CN)

(73) Assignee: Changxin Memory Technologies, Inc., Hefei (CN)

(*) Notice: Subject to any disclaimer, the term of this patent is extended or adjusted under 35 U.S.C. 154(b) by 223 days.

(21) Appl. No.: 17/396,686

(22) Filed: Aug. 7, 2021

(65) Prior Publication Data

US 2021/0366531 A1 Nov. 25, 2021

Related U.S. Application Data

(63) Continuation of application No. PCT/CN2020/131414, filed on Nov. 25, 2020.

(30) Foreign Application Priority Data

Mar. 25, 2020 (CN) .......................... 202010216794.0

(51) Int. Cl.
*G11C 11/40* (2006.01)
*G11C 11/4072* (2006.01)
(Continued)

(52) U.S. Cl.
CPC ...... *G11C 11/4072* (2013.01); *H01L 25/0652* (2013.01); *H01L 25/0657* (2013.01);
(Continued)

(58) Field of Classification Search
None
See application file for complete search history.

(56) References Cited

U.S. PATENT DOCUMENTS 6,393,374 B1* 5/2002 Rankin ................ G06F 1/3237
702/132
6,674,623 B1* 1/2004 Abe ...................... H02H 5/044
361/103
(Continued)

FOREIGN PATENT DOCUMENTS

CN 101866690 A 10/2010
CN 107810530 A 3/2018
(Continued)

OTHER PUBLICATIONS

PCT International Search Report and the Written Opinion dated Feb. 23, 2021, issued in related International Application No. PCT/CN2020/131414 (9 pages).
(Continued)

*Primary Examiner* — Tan T. Nguyen
(74) *Attorney, Agent, or Firm* — Sheppard Mullin Richter & Hampton LLP (57) ABSTRACT

A semiconductor structure and a preheating method thereof are provided. The semiconductor structure includes: a storage chip; a temperature detection unit configured to detect a temperature of the storage chip before the storage chip initiates; and a control chip configured to: before the storage chip initiates, heat the storage chip and determine whether the temperature detected by the temperature detection unit reaches a specified threshold; and if the temperature reaches the specified threshold, control the storage chip to initiate. When the semiconductor structure provided in the present invention works at a low temperature, the storage chip may be heated to the specified threshold, thereby preventing an increase of the resistances on the bit line, the word line, and the metal connection line in the storage chip, and improving the performance of read/write operations of the memory.

10 Claims, 3 Drawing Sheets

(51) Int. Cl.
  *H01L 25/065* (2023.01)
  *H01L 25/16* (2023.01)
  *H01L 25/18* (2023.01)

(52) U.S. Cl.
  CPC .............. *H01L 25/16* (2013.01); *H01L 25/18* (2013.01); *H01L 2225/06541* (2013.01); *H01L 2225/06589* (2013.01); *H01L 2225/06596* (2013.01)

(56) References Cited

U.S. PATENT DOCUMENTS

| | | | |
|---|---|---|---|
| 9,668,337 B2* | 5/2017 | Stoev | G11C 16/349 |
| 10,021,777 B2 | 7/2018 | Stoev et al. | |
| 10,224,078 B2 | 3/2019 | Goto et al. | |
| 10,371,745 B2* | 8/2019 | Schneider | G11C 29/06 |
| 10,789,995 B2* | 9/2020 | Pao | G11C 16/28 |
| 2002/0167065 A1* | 11/2002 | Graf | H01L 23/34 |
| | | | 257/467 |
| 2004/0199730 A1* | 10/2004 | Eggers | G06F 1/3225 |
| | | | 711/105 |
| 2008/0059703 A1 | 3/2008 | Yoshioka et al. | |
| 2008/0247252 A1* | 10/2008 | Ruf | G11C 5/14 |
| | | | 365/226 |
| 2013/0227261 A1 | 8/2013 | Anderson et al. | |
| 2017/0071056 A1 | 3/2017 | Stoev et al. | |
| 2017/0255403 A1* | 9/2017 | Sharon | G11C 11/5628 |
| 2018/0293029 A1* | 10/2018 | Achtenberg | G11C 29/028 |
| 2019/0348083 A1 | 11/2019 | Pao | |

FOREIGN PATENT DOCUMENTS

| | | |
|---|---|---|
| CN | 110489055 A | 11/2019 |
| CN | 211507637 U | 9/2020 |
| CN | 212303077 U | 1/2021 |
| CN | 212303078 U | 1/2021 |
| CN | 212303079 U | 1/2021 |
| JP | 2018-097903 A | 6/2018 |

OTHER PUBLICATIONS

PCT International Preliminary Report on Patentability dated Oct. 6, 2022, issued in related International Application No. PCT/CN2020/131414, with English translation (12 pages).
Extended European Search Report dated Jul. 25, 2022, issued in related European Patent Application No. 20926529.7 (8 pages).
Examination Report dated Feb. 9, 2023, issued in related European Patent Application No. 20926529.7 (5 pages).

* cited by examiner

SEMICONDUCTOR STRUCTURE AND PREHEATING METHOD THEREOF

CROSS-REFERENCE TO RELATED APPLICATIONS

This application is a continuation application of International Patent Application No.: PCT/CN2020/131414, filed on Nov. 25, 2020, which claims priority to Chinese Patent Application No.: 202010216794.0, filed on Mar. 25, 2020. The above-referenced applications are incorporated herein by reference in its entirety.

TECHNICAL FIELD

The present invention relates to the field of memory, and in particular, to a semiconductor structure and a preheating method thereof.

BACKGROUND

A dynamic random-access memory (DRAM) is a semiconductor storage device commonly used in a computer. The storage array of the DRAM includes many duplicate storage units. Each storage unit usually includes a capacitor and a transistor. The gate of the transistor is connected to a word line, the drain of the transistor is connected to a bit line, and the source of the transistor is connected to the capacitor. The voltage signal on the word line can control the ON or OFF of the transistor, and data can subsequently be read from or written into the capacitor through the bit line.

In existing techniques, a low temperature may prolong the write time for writing data into a memory and adversely affect the stability of the data to be written.

SUMMARY

The present invention presents a semiconductor structure and a preheating method for reducing write time in writing data into a memory at a low temperature and improving the stability of the data to be written.

One aspect of the present invention is directed to a semiconductor structure. The semiconductor structure may include a storage chip, a temperature detection unit, and a control chip.

The temperature detection unit may be configured to detect the temperature of the storage chip before the storage chip initiates.

The control chip may be configured to, before the storage chip initiates, heat the storage chip, determine whether the temperature detected by the temperature detection unit reaches a specified threshold, and, if the temperature reaches the specified threshold, control the storage chip to initiate.

In some embodiments, the semiconductor structure may include one or more storage chips. When the semiconductor structure includes two or more storage chips, the two or more storage chips may be sequentially stacked vertically.

In some embodiments, the one or more storage chips may be located on the control chip and electrically connected to the control chip.

In some embodiments, the semiconductor structure may further include a line substrate. The line substrate may have a connection line. The one or more storage chips and the control chip may both be located on the line substrate, and the one or more storage chips and the control chip may be connected through the connection line in the line substrate.

In some embodiments, the semiconductor structure may include one or more temperature detection units electrically connected to the control chip. The one or more temperature detection units may be in the control chip, in the storage chip, or on the line substrate between the storage chip and the control chip.

In some embodiments, the semiconductor structure may include only one temperature detection unit. And the control chip may be configured to: upon determining that the temperature detected by the temperature detection unit reaches the specified threshold, control all the one or more storage chips to initiate.

In some embodiments, the semiconductor structure may include only one temperature detection unit and two or more storage chips. And the control chip may be configured to: upon determining that the temperature detected by the temperature detection unit reaches the specified threshold, first, control a storage chip closest to the control chip to initiate, and then control other storage chips on the storage chip to sequentially initiate.

In some embodiments, the semiconductor structure may include two or more temperature detection units and two or more storage chips. Each storage chip may have one temperature detection unit. The control chip may be configured to: sequentially determine whether the temperatures detected by each of the temperature detection units reaches the specified threshold; and, if the temperature detected by one of the temperature detection units reaches the specified threshold, control the storage chip corresponding to the temperature detection unit to initiate.

In some embodiments, the control chip is further configured to: after the storage chip initiates, control the storage chip to perform write, read, and erase operations.

In some embodiments, the control chip may initiate before the control chip heat the storage chip, and the control chip may be configured to: heat the storage chip by using heat generated by the control chip after the control chip initiates.

In some embodiments, the control chip may have a heating circuit configured to heat the storage chip.

In some embodiments, the control chip may be configured to: before or after the control chip heats the storage chip, determine whether the temperature of the storage chip detected by the temperature detection unit reaches the specified threshold; and, if the temperature does not reach the specified threshold, control the heating circuit to heat the storage chip; or, if the temperature reaches the specified threshold, control the heating circuit to stop heating the storage chip.

In some embodiments, the storage chip may be a DRAM storage chip.

Another aspect of the present invention is directed to a semiconductor structure preheating method. The method may include providing a semiconductor structure, wherein the semiconductor structure may include a storage chip, a control chip electrically connected to the storage chip, and a temperature detection unit; initiating the control chip; heating, by the control chip and before the storage chip initiates, the storage chip; detecting a temperature of the storage chip by the temperature detection unit; and determining, by the control chip, whether the temperature detected by the temperature detection unit reaches a specified threshold; and, if the temperature reaches the specified threshold, initiating the storage chip.

In some embodiments, the semiconductor structure may include one or more temperature detection units and one or more storage chips. When the semiconductor structure includes two or more storage chips, the two or more storage chips may be sequentially stacked vertically.

In some embodiments, the semiconductor structure may include only one temperature detection unit. The control chip may be configured to: upon determining that the temperature detected by the temperature detection unit reaches the specified threshold, control all the one or more storage chips to initiate.

In some embodiments, the semiconductor structure may include only one temperature detection unit and two or more storage chips. The control chip is configured to: upon determining that the temperature detected by the temperature detection unit reaches the specified threshold, first, control the storage chip closest to the control chip to initiate, and then control other storage chips on the storage chip to sequentially initiate.

In some embodiments, the semiconductor structure may include two or more temperature detection units and two or more storage chips. Each storage chip may have one temperature detection unit. The control chip may be configured to: sequentially determine whether the temperatures detected by each of the temperature detection units reaches the specified threshold; and, if the temperature detected by one of the temperature detection units reaches the specified threshold, control the storage chip corresponding to the temperature detection unit to initiate.

In some embodiments, the control chip is further configured to: after the storage chip initiates, control the storage chip to perform write, read, and erase operations.

Compared with existing techniques, the technical solutions provided by the present invention have the following advantages.

The semiconductor structure provided in the present invention may include a storage chip, a temperature detection unit, and a control chip. The temperature detection unit may be configured to detect the temperature of the storage chip before the storage chip initiates. The control chip may be configured to, before the storage chip initiates, heat the storage chip and determine whether the temperature detected by the temperature detection unit reaches a specified threshold; and, if the temperature reaches the specified threshold, control the storage chip to initiate. The control chip may be configured to cooperate with the temperature detection unit. The control chip may heat the storage chip before the storage chip initiates. The temperature detection unit may detect the temperature of the storage chip before the storage chip initiates. And the control chip may determine whether the temperature detected by the temperature detection unit reaches the specified threshold, and, if the temperature reaches the specified threshold, control the storage chip to initiate. Therefore, when the semiconductor structure provided in the present invention works at a low temperature, the storage chip may be heated to the specified threshold by the control chip, thereby preventing an increase of the resistances of the bit line, the word line, and the metal connection line (metal contact part) in the storage chip due to an excessively low temperature, reducing the write time for writing data into the memory at the low temperature and improving the write stability of the memory.

In some embodiments, the semiconductor structure may include only one temperature detection unit. The temperature detection unit may be in the control chip, in the storage chip, or on the line substrate between the storage chip and the control chip. The control chip may be configured to: upon determining that the temperature detected by the temperature detection unit reaches the specified threshold, control all the storage chips to initiate. When there are multiple storage chips in the semiconductor structure, the aforementioned control structure and control manner may be relatively simple, and may reduce the write time for writing data into the storage chip at a low temperature and improve the write stability of the storage chip.

In some embodiments, the semiconductor structure may include only one temperature detection unit and two or more storage chips. The control chip may be configured to: upon determining that the temperature detected by the temperature detection unit reaches the specified threshold, first, control the storage chip closest to the control chip to initiate, and then control other storage chips on the storage chip to sequentially initiate. When there are multiple storage chips in the semiconductor structure, the aforementioned control structure and control manner may cause each storage chip to initiate after reaching the specified threshold, thereby improving the precision of the initiation of each storage chip, reducing the write time for writing data into each storage chip at a low temperature and improving the write stability of each storage chip.

In some embodiments, the semiconductor structure may include two or more temperature detection units and two or more storage chips. Each storage chip may have one temperature detection unit. The control chip may be configured to: sequentially determine whether the temperature detected by each of the temperature detection units reaches the specified threshold; and, if the temperature detected by one of the temperature detection units reaches the specified threshold, control the storage chip corresponding to the temperature detection unit to initiate. When there are multiple storage chips in the semiconductor structure, the aforementioned control structure and control manner may further improve the precision of the initiation of each storage chip, thereby reducing the write time for writing data into each storage chip at a low temperature and further improving the write stability of each storage chip.

In some embodiments, the control chip may initiate before the control chip heat the storage chip. And the control chip may heat the storage chip by using heat generated by the control chip after the control chip initiates. Therefore, no additional heating circuit may be needed, thereby simplifying the semiconductor structure.

In some embodiments, the control chip may have a heating circuit configured to heat the storage chip. Before or after the control chip heats the storage chip, the control chip may be configured to determine whether the temperature of the storage chip detected by the temperature detection unit reaches the specified threshold. If the temperature does not reach the specified threshold, the control chip may control the heating circuit to heat the storage chip. If the temperature reaches the specified threshold, the control chip may control the heating circuit to stop heating the storage chip. Therefore, the heating process may be accurately controlled, so that the temperature of the storage chip can be kept near the specified threshold, thereby preventing the temperature of the storage chip from being excessively high or excessively low, and always keeping the write time of the memory relatively short.

In the semiconductor structure preheating method provided in the present invention, before a storage chip initiates, the storage chip may be heated by a control chip. The temperature of the storage chip may be detected by a temperature detection unit. The control chip may be configured to determine whether the temperature detected by the temperature detection unit reaches a specified threshold. If the temperature reaches the specified threshold, the storage chip may be controlled to initiate. Therefore, when the semiconductor structure provided in the present invention works at a low temperature, the storage chip may be heated to the specified threshold by using the control chip, thereby preventing an increase of the resistances of the bit line, the word line, and the metal connection line (metal contact part) in the storage chip due to an excessively low temperature, reducing the write time for writing data into the memory at the low temperature and improving the write stability of the memory.

DESCRIPTION OF EMBODIMENTS

As described in the Background section, in existing techniques, a lower temperature may prolong the write time for writing data into a memory and adversely affect the stability of the data to be written.

When a conventional memory works at a low temperature, the resistances of the bit line, the word line, the metal connection line (metal contact part), and the like in the memory would increase due to the low temperature. The write time for writing data into the memory would change or increase due to the resistance increase, thereby affecting the write stability of the memory.

The present invention presents a semiconductor structure and a preheating method thereof to address the foregoing issues.

The semiconductor structure may include a storage chip, a temperature detection unit, and a control chip. The temperature detection unit may be configured to detect the temperature of the storage chip before the storage chip initiates. The control chip may be configured to, before the storage chip initiates, heat the storage chip and determine whether the temperature detected by the temperature detection unit reaches a specified threshold, and, if the temperature reaches the specified threshold, control the storage chip to initiate. In this specification, the "initiation" of a chip may refer to the start or power on of the chip. Therefore "a chip initiates" may mean the chip is started or powered on.

The control chip may be configured to cooperate with the temperature detection unit. The control chip may heat the storage chip before the storage chip initiates. The temperature detection unit may detect the temperature of the storage chip before the storage chip initiates. The control chip may determine whether the temperature detected by the temperature detection unit reaches the specified threshold. If the temperature reaches the specified threshold, the control chip may control the storage chip to initiate. Therefore, when the semiconductor structure provided in the present invention works at a low temperature, the storage chip may be heated to the specified threshold by the control chip, thereby preventing an increase of the resistances of the bit line, the word line, and the metal connection line (metal contact part) in the storage chip due to an excessively low temperature, reducing the write time for writing data into the memory at the low temperature and improving the write stability of the memory.

To make the foregoing objects, features, and advantages of the present invention clearer and easier to understand, the specific implementations of the present invention will be described through the following detailed description with reference to the accompanying drawings. When describing the embodiments of the present invention in detail, for the sake of illustration, the schematic diagrams may be enlarged partially. The schematic diagrams are exemplary and should not constitute a limitation on the protection scope of the present invention herein. Additionally, three-dimensional spatial sizes of length, width, and depth should be included in actual production.

FIGS. 1, 2, 3, 4, 5, 6, and 7 are schematic structural diagrams of a semiconductor structure according to one or more embodiments of the present invention. FIG. 8 is a schematic flowchart of a semiconductor structure preheating method according to one or more embodiments of the present invention.

Figure 1:
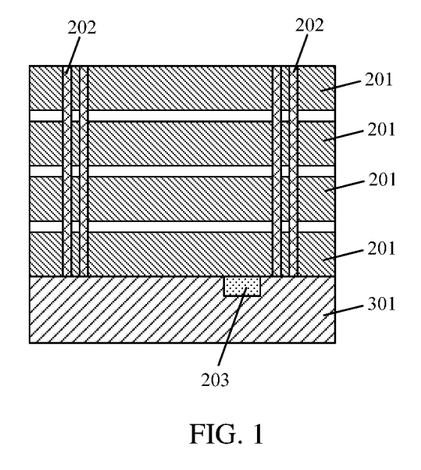
FIGS. 1, 2, 3, 4, 5, 6, and 7 are schematic structural diagrams of a semiconductor structure according to one or more embodiments of the present invention.

Referring to FIG. 1, a semiconductor structure is provided. The semiconductor structure may include a storage chip 201; a temperature detection unit 203, a control chip 301. The temperature detection unit 203 may be configured to detect the temperature of the storage chip 201 before the storage chip 201 initiates. The control chip 301 may be configured to, before the storage chip 201 initiates, heat the storage chip 201 and determine whether the temperature detected by the temperature detection unit 203 reaches a specified threshold, and, if the temperature reaches the specified threshold, control the storage chip 201 to initiate.

The storage chip 201 may be a memory that can perform data write, data read, and/or data deletion. The storage chip 201 may be formed by using a semiconductor integrated production process. Specifically, the storage chip 201 may include a storage array and a peripheral circuit connected to the storage array. The storage array may include several storage units, and a bit line, a word line, and a metal connection line (metal contact part) that are connected to each storage unit. The storage unit may be configured to store data. The peripheral circuit may be a related circuit used when performing an operation on the storage array.

In some embodiments, the storage chip 201 may be a DRAM storage chip. The DRAM storage chip may include several storage units. Each of the storage units may include a capacitor and a transistor. The gate of the transistor may be connected to a word line, the drain of the transistor may be connected to a bit line, and the source of the transistor may be connected to the capacitor.

In some embodiments, the storage chip 201 may be other types of storage chips, and this specification is not limited in this regard.

The number of storage chips 201 may be at least 1. Specifically, the number of storage chips 201 may be 1 or greater than or equal to 2. When the number of storage chips is greater than or equal to 2, the storage chips may be sequentially stacked vertically to form a stacked storage chip structure.

Figure 2:
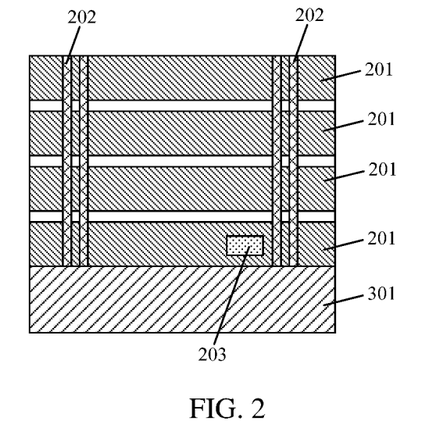

Referring to FIG. 2, in some embodiments, the number of storage chips 201 may be 4. The four storage chips 201 may be sequentially stacked from bottom to top to form a stacked storage chip structure. Adjacent storage chips 201 may be bonded together through a bonding process or an adhering process. In some embodiments, a through-silicon via (TSV) may be formed in the storage chip 201. The storage chip 201 may be electrically connected to the control chip 301 through the through-silicon via (TSV). When multiple storage chips 201 are stacked, each storage chip 201 may be connected to the control chip 201 through a different through-silicon via (TSV). In some embodiments, the storage chip 201 may be alternatively connected to the control chip 301 by using a metal lead (formed by a lead bonding process).

In some embodiments, the storage chip 201 may be located on the control chip 301 and electrically connected to the control chip 301. When there is only one storage chip 201, the control chip 301 may be bonded to the storage chip 201. When there are multiple storage chips 201 forming a stacked storage chip structure, the control chip 301 may be bonded to the storage chip 201 at the bottom layer in the stacked structure.

In some embodiments, the storage chip 201 and the control chip 301 may be connected in different manners. Referring to FIGS. 4, 5, 6, and 7, the semiconductor structure may further include a line substrate 401. The line substrate 401 may have a connection line. The storage chip 201 and the control chip 301 may both be located on the line substrate 401, and the storage chip 201 and the control chip 301 may be connected by using the connection line in the line substrate 401. The line substrate 401 may be a PCB substrate.

Figure 4:
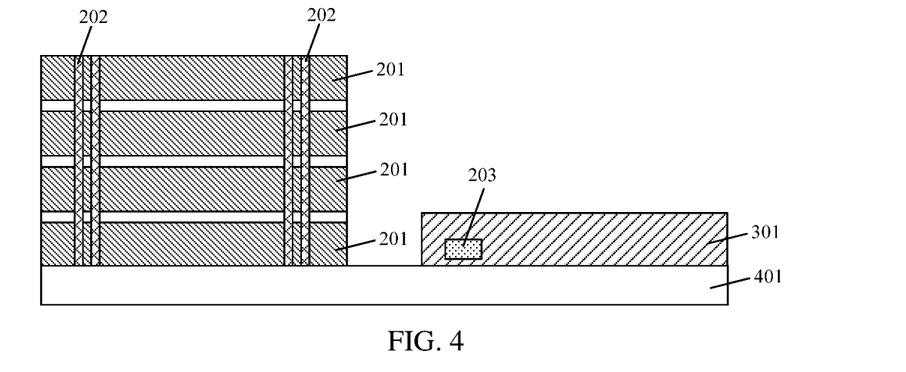

Referring to FIGS. 1 and 4, the control chip 301 may be formed by using the semiconductor integrated production process. The control chip 301 may be configured to heat the storage chip 201, so that the temperature of the storage chip 201 can reach the specified threshold. The specified threshold may be set in the control chip 301 based on an actual need or experience. The control chip 301 may be further configured to control the initiation of the storage chip 201, which may include power-on and self-testing, and the performing of related operations on the storage chip 201, which may include writing data into the storage chip 201, reading data from the storage chip 201, deleting data stored in the storage chip 201, and the like.

The semiconductor structure may further include the temperature detection unit 203. The temperature detection unit 203 may be configured to measure the temperature of the storage chip 201 before the storage chip 201 initiates. The temperature detection unit 203 may be electrically connected to the control chip 301.

The temperature detected by the temperature detection unit 203 may be sent to the control chip 301, and may serve as the basis for controlling, by the control chip 301, the storage chip 201 to initiate. Specifically, the control chip 301 may be configured to cooperate with the temperature detection unit 203. The control chip 301 may heat the storage chip 201 before the storage chip 201 initiates. The temperature detection unit 203 may detect the temperature of the storage chip 201 before the storage chip 201 initiates. And the control chip 301 may determine whether the temperature detected by the temperature detection unit 203 reaches the specified threshold, and, if the temperature reaches the specified threshold, control the storage chip 201 to initiate.

Therefore, when the semiconductor structure provided in the present invention works at a low temperature, the storage chip 201 may be heated to the specified threshold by using the control chip 301, thereby preventing an increase of the resistances of the bit line, the word line, and the metal connection line (metal contact part) in the storage chip due to an excessively low temperature, reducing the write time for writing data into the memory at the low temperature, and improving the write stability of the memory.

Figure 5:
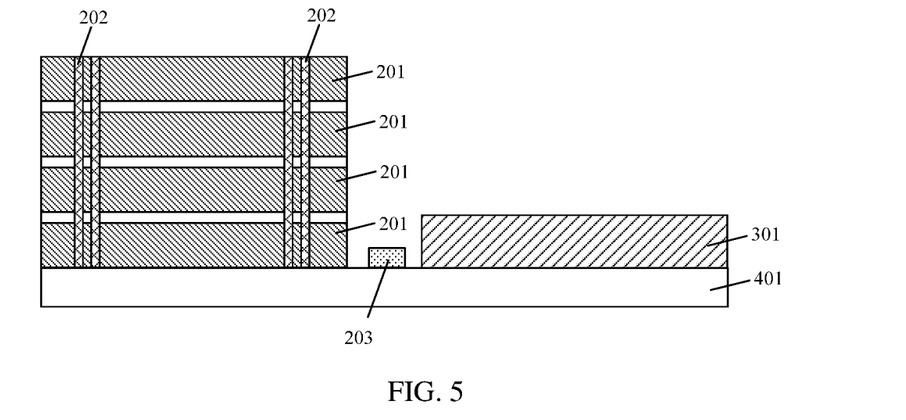

The temperature detection unit 203 may include a temperature sensor. The temperature sensor may be configured to sense a temperature and convert the sensed temperature into an electrical signal. In some embodiments, the temperature sensor may be a P-N junction temperature sensor or a capacitive temperature sensor. The temperature sensor may be formed by using the semiconductor integrated production process, and may be located in the storage chip 201, in the control chip 301, or located on the line substrate 401 between the storage chip 201 and the control chip 301, as shown in FIG. 5.

The number of temperature detection units 203 may be 1 or greater than or equal to 2. The temperature detection unit 203 may be in the control chip 301 or in the storage chip 201.

Figure 6:
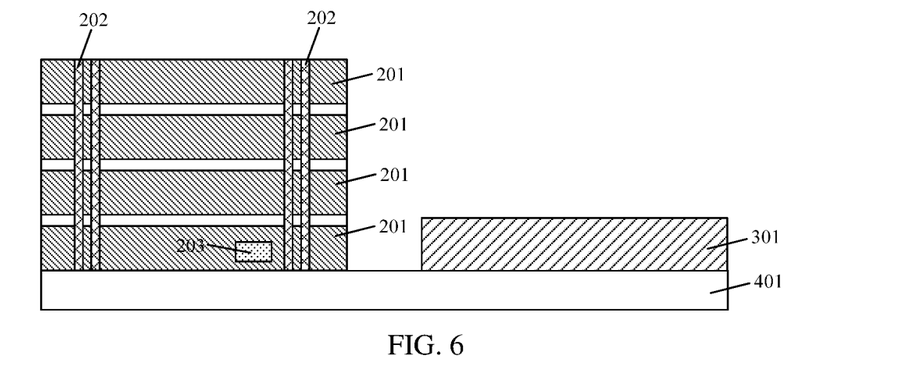

In some embodiments, the number of temperature detection units 203 may be 1. Specifically, the temperature detection unit 203 may be in the control chip 301, as shown in FIGS. 1 and 4. Alternatively, the temperature detection unit 203 may be in the storage chip 201. When there is only one storage chip 201, the temperature detection unit 203 may be directly located in the storage chip 201. When there are multiple storage chips 201 forming a stacked structure, the temperature detection unit 203 may be located in one of the storage chips 201, and may be preferably located in the storage chip 201 at the bottom layer in the stacked structure, as shown in FIGS. 2 and 6. The temperature detection unit 203 may be on the line substrate 401 between the storage chip 201 and the control chip 301, as shown in FIG. 5.

Upon determining that the temperature detected by the temperature detection unit 203 reaches the specified threshold, the control chip 301 may control all storage chips 201 to initiate. When there are multiple storage chips 201 in the semiconductor structure, the aforementioned control structure and control manner may be relatively simple, and may reduce the write time for writing data into the storage chip 201 at a low temperature and improve the write stability of the storage chip 201.

In some embodiments, referring to FIGS. 1, 2, 4, 5, and 6, the number of temperature detection units 203 may be 1 and the number of storage chips 201 may be greater than or equal to 2. Upon determining that the temperature detected by the temperature detection unit 203 reaches the specified threshold, the control chip 301 may first control the storage chip 201 closest to the control chip 301 to initiate, and then control other storage chips 201 above to sequentially initiate.

Referring to FIG. 2, when there are four storage chips 201, upon determining that the temperature detected by the temperature detection unit 203 reaches the specified threshold, the control chip 301 may first control the storage chip 201 closest to the control chip 301 (the storage chip at the bottom layer in the stacked structure) to initiate, and then control the other three storage chips 201 above to sequentially initiate. When there are multiple storage chips 201 in the semiconductor structure, the aforementioned control structure and control manner may cause each storage chip 201 to initiate after the specified threshold temperature is reached, thereby improving the precision of the initiation of each storage chip 201, reducing the write time for writing data into each storage chip 201 at a low temperature and improving the write stability of each storage chip 201.

Figure 3:
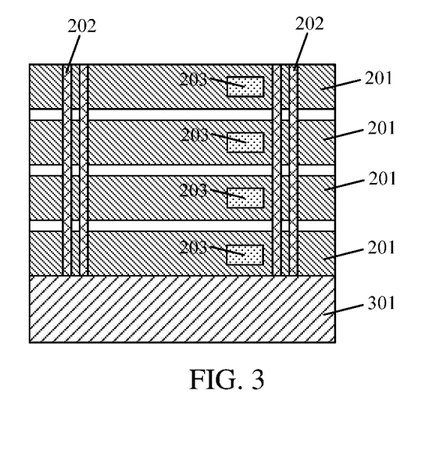
Figure 7:
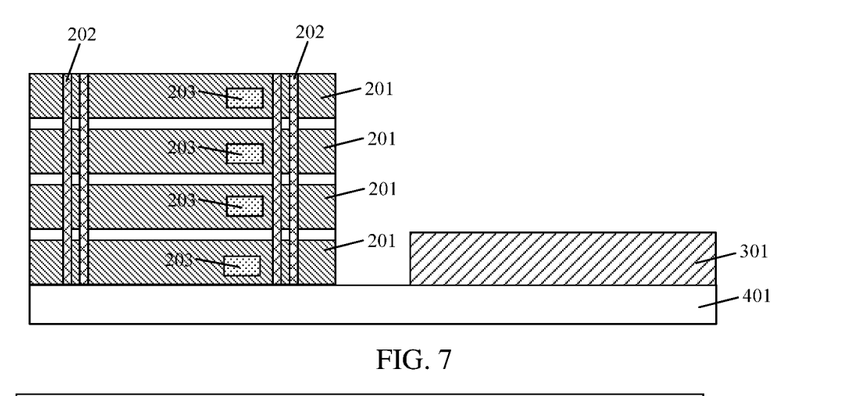
Figure 8:
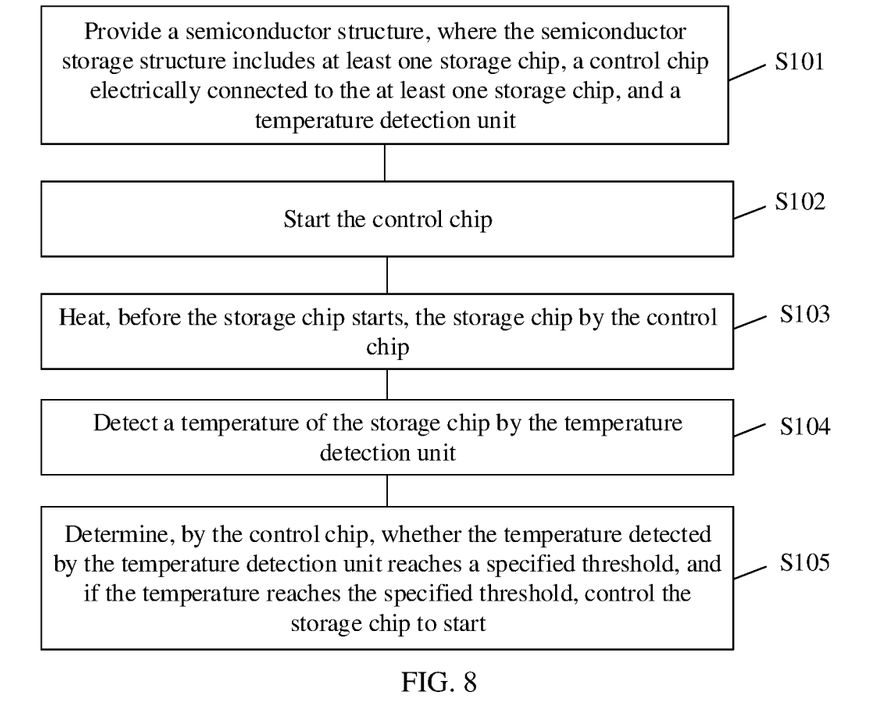
FIG. 8 is a flowchart of a semiconductor structure preheating method according to one or more embodiments of the present invention.

In some embodiments, referring to FIGS. 3 and 7, the number of temperature detection units 203 may be greater than or equal to 2 and the number of storage chips 201 may be greater than or equal to 2. Each storage chip 201 may have one temperature detection unit 203.

The control chip 301 may sequentially determine whether the temperature detected by each of the temperature detection units 203 reaches the specified threshold, and, if the temperature detected by one of the temperature detection units 203 reaches the specified threshold, control the storage chip corresponding to the temperature detection unit 203 to initiate. There may be four storage chips 201 in a stacked structure, as shown in FIGS. 3 and 7, and each storage chip 201 may correspondingly have one temperature detection unit 203. Therefore, each temperature detection unit 203 may detect the temperature of a corresponding storage chip 201, thereby obtaining four detected temperatures.

The control chip 301 may sequentially determine whether the temperature detected by each of the four temperature detection units 203 reaches the specified threshold, and, if the temperature detected by one of the temperature detection units 203 reaches the specified threshold, control the storage chip corresponding to the temperature detection unit 203 to initiate. For example, when the temperature detected by the temperature detection unit 203 in the storage chip 201 at the bottom layer in the stacked structure first reaches the specified threshold, the control chip 301 may first control the storage chip 201 at the bottom layer in the stacked structure to initiate. Then, when the temperature detected by the corresponding temperature detection unit 203 in the storage chip 201 at the penultimate layer in the stacked structure also reaches the specified threshold, the control chip 301 may control the storage chip 201 at the penultimate layer in the stacked structure to initiate. The initiation of the storage chips 201 on the two upper layers may be conducted in the same manner.

When there are multiple storage chips 201 in the semiconductor structure, the aforementioned control structure and control manner may further improve the precision of the of each storage chip 201, reducing the write time for writing data into each storage chip 201 at a low temperature and improving the write stability of each storage chip 201.

In some embodiments, before the control chip 301 heats the storage chip 201, the control chip 301 may need to initiate. In one example, the control chip 301 may need to be powered on and self-tested. When the control chip 301 initiates, the control chip 301 may not give an instruction to the storage chip 201. Only when the temperature detected by the temperature detection unit reaches the specified threshold, the control chip 301 may control the storage chip 201 to initiate. The control chip 301 may heat the storage chip using the heat generated by the control chip 301 after the control chip 301 initiates. Therefore, no additional heating circuit may be needed, thereby simplifying the semiconductor structure.

The control chip 301 may perform various operations to generate heat to heat the storage chip 201. The operations the control chip 301 may perform to generate heat may be predetermined according to actual needs. For example, the operations may be predetermined according to desired heating speeds and/or power consumption requirements. The specific operations the control chip may perform are not limited in this specification.

In some embodiments, after the control chip 301 controls the storage chip 201 to initiate, the control chip 301 may further control the storage chip 201 to perform write, read, and erase operations. The control chip 301 may have a control circuit. The control circuit may be configured to control the storage chip 201 to initiate and control the storage chip 201 to perform write, read, and erase operations.

In some embodiments, the control chip 301 may have a heating circuit, configured to heat the storage chip 201. Before or after the control chip 301 heats the storage chip 201, the control chip may determine whether the temperature of the storage chip detected by the temperature detection unit reaches the specified threshold. If the temperature does not reach the specified threshold, the control chip may control the heating circuit to heat the storage chip. If the temperature reaches the specified threshold, the control chip may control the heating circuit to stop heating the storage chip. Therefore, the heating process may be accurately controlled, so that the temperature of the storage chip 201 can be kept near the specified threshold, thereby preventing the temperature of the storage chip 201 from being excessively high or low, and preventing the write time of the memory from being prolonged under undesirable temperatures.

This invention further presents a semiconductor structure preheating method. Referring to FIG. 8, the method may include the following steps S101 through S105.

In step S101, a semiconductor structure may be provided. The semiconductor structure may include a storage chip, a control chip electrically connected to the storage chip, and a temperature detection unit.

In step S102, the control chip may initiate.

In step S103, before the storage chip initiates, the storage chip may be heated by the control chip.

In step S104, the temperature of the storage chip may be detected by the temperature detection unit.

In step S105, the control chip may determine whether the temperature detected by the temperature detection unit reaches a specified threshold, and, if the temperature reaches the specified threshold, control the storage chip to initiate.

In some embodiments, the number of temperature detection units may be 1 or greater than or equal to 2, and the number of storage chips may be 1 or greater than or equal to 2. When the number of storage chips is greater than or equal to 2, several storage chips may be sequentially stacked vertically.

In some embodiments, the number of temperature detection units may be 1. Upon determining that the temperature detected by the temperature detection unit reaches the specified threshold, the control chip may control all storage chips to initiate.

In some embodiments, the number of temperature detection units may be 1 and the number of storage chips may be greater than or equal to 2. Upon determining that the temperature detected by the temperature detection unit reaches the specified threshold, the control chip may first control the storage chip closest to the control chip to initiate, and then control other storage chips on the storage chip to sequentially initiate.

In some embodiments, the number of temperature detection units may be greater than or equal to 2 and the number of storage chips may be greater than or equal to 2. Each storage chip may have one temperature detection unit. The control chip may sequentially determine whether the temperatures detected by each of the temperature detection units reach the specified threshold, and, if the temperature detected by one of the temperature detection units reaches the specified threshold, control the storage chip corresponding to the temperature detection unit to initiate.

In some embodiments, after the control chip controls the storage chip to initiate, the control chip may further control the storage chip to perform write, read, and erase operations.

The limitation or description of the same or similar part in the embodiments of the method compared to the foregoing embodiments of the semiconductor structure will not be described repeatedly, the details of which may be referred to a corresponding part in the foregoing semiconductor structure embodiments.

Although the present invention has been disclosed above in the preferred embodiments, such preferred embodiments are not intended to limit the present invention. Any person skilled in the art may make a possible change and modification to the technical solutions of the present invention based on the foregoing disclosed method and technical content without departing from the spirit and scope of the present invention. Therefore, any simple alteration, equivalent change, and modification made to the foregoing embodiments based on the technical essence of the present invention without departing from the content of the technical solutions of the present invention fall within the protection scope of the technical solutions of the present invention.

What is claimed is:

1. A semiconductor structure, comprising:
   a storage chip;
   a temperature detection unit, configured to detect a temperature of the storage chip before the storage chip initiates; and
   a control chip, configured to:
      before the storage chip initiates, heat the storage chip, determine whether the temperature detected by the temperature detection unit reaches a specified threshold, and,
      in response to the temperature reaching the specified threshold, control the storage chip to initiate,
   wherein the semiconductor structure comprises one or more storage chips, and, when the semiconductor structure comprises two or more storage chips, the two or more storage chips are sequentially stacked vertically,
   wherein the one or more storage chips are located on the control chip and electrically connected to the control chip,
   wherein the semiconductor structure comprises one or more temperature detection units electrically connected to the control chip, and the one or more temperature detection units are located:
   in the control chip;
   in the one or more storage chips; or
   on the line substrate between the storage chips and the control chip,
   wherein, when the semiconductor structure comprises two or more temperature detection units and two or more storage chips, each storage chip has one temperature detection unit, and wherein the control chip is configured to:
   sequentially determine whether the temperature detected by each of the temperature detection units reaches the specified threshold; and
   in response to the temperature detected by one of the temperature detection units reaching the specified threshold, control the storage chip corresponding to the temperature detection unit to initiate.

2. The semiconductor structure of claim 1, further comprising:
   a line substrate comprising a connection line, the one or more storage chips and the control chip are both located on the line substrate, and the one or more storage chips and the control chip are connected through the connection line in the line substrate.

3. The semiconductor structure of claim 1, wherein the control chip is further configured to:
   after the storage chip initiates, control the storage chip to perform write, read, and erase operations.

4. The semiconductor structure of claim 3, wherein the control chip initiates before the control chip heats the storage chip, and the control chip is configured to heat the storage chip by using heat generated by the control chip after the control chip initiates.

5. The semiconductor structure of claim 1, wherein the control chip comprises a heating circuit configured to heat the storage chip.

6. The semiconductor structure of claim 5, wherein the control chip is configured to:
   before or after the control chip heats the storage chip, determine whether the temperature of the storage chip detected by the temperature detection unit reaches the specified threshold; and
   in response to the temperature not reaching the specified threshold, control the heating circuit to heat the storage chip; or
   in response to the temperature reaching the specified threshold, control the heating circuit to stop heating the storage chip.

7. The semiconductor structure of claim 1, wherein the storage chip is a DRAM chip.

8. A semiconductor structure preheating method, comprising:
   providing a semiconductor structure, wherein the semiconductor structure comprises a storage chip, a control chip electrically connected to the storage chip, and a temperature detection unit;
   initiating the control chip;
   heating, by the control chip and before the storage chip initiates, the storage chip;
   detecting, by the temperature detection unit, a temperature of the storage chip;
   determining, by the control chip, whether the temperature detected by the temperature detection unit reaches a specified threshold; and
   in response to the temperature reaching the specified threshold, initiating the storage chip,
   wherein the semiconductor structure comprises one or more temperature detection units and one or more storage chips, and wherein when the semiconductor structure comprises two or more storage chips, the two or more storage chips are sequentially stacked vertically,
   wherein, when the semiconductor structure comprises two or more temperature detection units and two or more storage chips, each storage chip has one temperature detection unit, and wherein the control chip is configured to:
   sequentially determine whether the temperature detected by each of the temperature detection units reaches the specified threshold; and
   in response to the temperature detected by one of the temperature detection units reaching the specified threshold, control the storage chip corresponding to the temperature detection unit to initiate.

9. The preheating method of claim 8, wherein the control chip is further configured to:
   after the storage chip initiates, control the storage chip to perform write, read, and erase operations.

10. A semiconductor structure preheating method, comprising:
    providing a semiconductor structure, wherein the semiconductor structure comprises a storage chip, a control chip electrically connected to the storage chip, and a temperature detection unit;
    initiating the control chip;
    heating, by the control chip and before the storage chip initiates, the storage chip;
    detecting, by the temperature detection unit, a temperature of the storage chip;

determining, by the control chip, whether the temperature detected by the temperature detection unit reaches a specified threshold; and in response to the temperature reaching the specified threshold, initiating the storage chip, wherein the semiconductor structure comprises one or more temperature detection units and one or more storage chips, and wherein when the semiconductor structure comprises two or more storage chips, the two or more storage chips are sequentially stacked vertically, wherein, when the semiconductor structure comprises only one temperature detection unit and two or more storage chips, the control chip is configured to:

upon determining that the temperature detected by the temperature detection unit reaches the specified threshold, first, control the storage chip closest to the control chip to initiate, and then controls other storage chips on the storage chip to sequentially initiate.

* * * * *